United States Patent
Fischer et al.

(10) Patent No.: US 6,376,358 B1
(45) Date of Patent: Apr. 23, 2002

(54) METHOD OF FORMING PLUGS AND LOCAL INTERCONNECT FOR EMBEDDED MEMORY/SYSTEM-ON-CHIP (SOC) APPLICATIONS

(75) Inventors: Mark Fischer; Jigish D. Trivedi, both of Boise, ID (US); Charles H. Dennison, San Jose, CA (US); Todd R. Abbott; Raymond A. Turi, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/809,666

(22) Filed: Mar. 15, 2001

(51) Int. Cl.⁷ .......................................... H01L 21/8242
(52) U.S. Cl. ..................... 438/621; 438/655; 438/656; 438/657; 438/253
(58) Field of Search ................... 438/621, 655, 438/656, 657, 253

(56) References Cited

U.S. PATENT DOCUMENTS

| | | | |
|---|---|---|---|
| 5,504,707 A | 4/1996 | Koizumi | 365/185.04 |
| 5,736,421 A | 4/1998 | Shimomura et al. | 437/52 |
| 5,838,603 A | 11/1998 | Mori et al. | 365/241 |
| 5,858,831 A | 1/1999 | Sung | 438/234 |
| 5,883,814 A | 3/1999 | Luk et al. | 364/491 |
| 5,918,120 A * | 6/1999 | Huang | 438/239 |
| 5,998,251 A | 12/1999 | Wu et al. | 438/241 |
| 6,037,216 A * | 3/2000 | Liu et al. | 438/253 |
| 6,037,606 A | 3/2000 | Ema | 257/37 |
| 6,051,462 A | 4/2000 | Ohno | 438/241 |
| 6,177,340 B1 * | 1/2001 | Yoo et al. | 438/637 |
| 6,294,420 B1 * | 9/2001 | Tsu et al. | 438/239 |

OTHER PUBLICATIONS

Wolf, Stanley et al., Silicon Processing for the VLSI Era, vol. 1, pp. 207–213, and 834–837, Second Edition, 2000 Lattice Press, Sunset Beach, California. No Date.

* cited by examiner

Primary Examiner—Chandra Chaudhari
Assistant Examiner—Stephen W. Smoot
(74) Attorney, Agent, or Firm—Whyte Hirschboeck Dudek SC

(57) ABSTRACT

A process for fabricating system-on-chip devices which contain embedded DRAM along with other components such as SRAM or logic circuits is disclosed. Local interconnects, via salicides and tungsten are formed subsequent to polysilicon plugs required for the operation of the DRAM and SRAM or logic. Also disclosed are systems-on-chips MIM/MIS capacitive devices produced by the inventive process.

28 Claims, 6 Drawing Sheets

METHOD OF FORMING PLUGS AND LOCAL INTERCONNECT FOR EMBEDDED MEMORY/SYSTEM-ON-CHIP (SOC) APPLICATIONS

FIELD OF THE INVENTION

This invention is directed to a method for fabricating chips having embedded memory and other components, such as logic circuits. More particularly, this invention is directed to a simple method for providing plugs and local interconnects in chips having embedded DRAM.

BACKGROUND OF THE INVENTION

Combining both embedded DRAM memory and other components, such as high speed logic circuits, onto a single chip is often useful. For example, U.S. Pat. No. 5,883,814 discloses advantages to such a system-on-chip (SOC) including faster speed and overcoming bandwidth and capacitance problems associated with off-chip connections between arrays of memory and logic.

Systems-on-chip include memory-in-logic, where memory circuits are embedded in primarily logic blocks and logic-in-memory which are predominantly memory blocks with some logic circuitry. Increasingly important applications for systems-on-chip include high-performance, low-power multi-media apparatus.

In systems comprising both memory and logic, both the memory and logic are preferably made with as many common processing steps as possible. However, many process steps that are conveniently used for logic and SRAM applications, such as metal local interconnects, are not practical for embedded memory applications, specifically DRAM, because of the leakage/refresh requirements for the DRAM process.

A hallmark of this invention is a process for fabricating low resistance local interconnects and polysilicon plugs for a combined embedded memory/logic array.

SUMMARY OF THE INVENTION

The applicants have found via this invention that the formation of low resistance interconnects and plugs with metal silicide interconnects can be used in the same chip with DRAM arrays.

One embodiment of the invention is a method of fabricating silicided plugs, the method comprising the steps of: (i) providing a silicon substrate having at least one N-type doped region and at least one P-type doped region, wherein the N-type doped region and P-type doped region are arranged to form at least one diffused source/drain junction or are separated by isolation wherein the silicon substrate is overlaid with an insulative layer; (ii) opening a first hole in the insulative layer to expose the diffused source/drain junction (if present) and at least part of the N-type doped region or P-type doped region; (iii) forming a layer of a first highly doped polysilicon having the same doping as the region exposed in step (ii) within the first hole to form a first plug, such that the layer of first highly doped polysilicon is at least as high as the insulative layer; (iv) opening a second hole in the insulative layer adjacent to the first plug to expose at least part of the doped region having a different type doping than the first highly doped polysilicon; (v) forming a layer of a second highly doped polysilicon, having the same type doping as the region exposed by the second hole, within the second hole to form a second plug abutting the first plug, such that the layer of second highly doped polysilicon is at least as high as the insulative layer; and, (vi) forming a metal silicide layer on top of both the first plug and the second plug electrically connecting the first and second plugs (local interconnect).

Another preferred embodiment of the invention is a method of fabricating a system-on-chip, the method comprising the steps of: (i) providing a semiconductor device comprising a silicon substrate, the silicon substrate having arrayed thereon at least one first component comprising a DRAM wordline and at least one second component selected from the group consisting of a device comprising a logic gate, an SRAM or a combination thereof, wherein the silicon substrate, the first component and the second component are overlaid with a layer of an insulative material, wherein a first silicon plug, in electrical contact with the first component and second component, extends through the layer of insulative material to the silicon substrate of like doping and a second silicon plug, in electrical contact with the second component, extends through the layer of protective material to the silicon substrate of like doping; and (ii) forming a metal silicide layer on the first plug and the second plug creating a local interconnect in the second component.

Another preferred embodiment of the invention is a method of fabricating a system-on-chip, the method comprising the steps of: (i) providing a semiconductor device comprising a silicon substrate, the silicon substrate having arrayed thereon at least one first component comprising a DRAM wordline and at least one second component selected from the group consisting of a device comprising a logic gate, an SRAM or a combination thereof, wherein the silicon substrate, the first component and the second component are overlaid with a layer of a insulative material, wherein a first silicon plug, in electrical contact with the first component and second component, extends through the layer of insulative material to the silicon substrate of like doping and a second silicon plug, in electrical contact with the second component, extends through the layer of insulative material to the silicon substrate of like doping; (ii) depositing a second insulative layer on top of the first insulative material, the first plug and the second plug; (iii) opening a hole in the second insulative layer to expose a local interconnect pattern for the second component; and (iv) depositing a layer of refractory metal (and associated thin barrier/adhesive layers of Titanium (Ti)/Titanium nitride (TiN)) in the hole to form a local interconnect.

Still another preferred embodiment of the invention is a method of fabricating a system-on-chip, the method comprising the steps of: (i) providing a semiconductor device comprising a silicon substrate, the silicon substrate having arrayed thereon at least one first component comprising a DRAM wordline and at least one second component selected from the group consisting of a device comprising a logic gate, an SRAM or a combination thereof, wherein the silicon substrate, the first component and the second component are overlaid with a layer of a insulative material, wherein a first silicon plug, in electrical contact with the first component and second component, extends through the layer of protective material to the silicon substrate of like doping and a second silicon plug, in electrical contact with the second component, extends through the layer of insulative material to the silicon substrate of like doping; (ii) depositing a second insulative layer on top of the layer of first insulator material, the first plug and the second plug; (iii) opening a first hole in the second insulator layer to expose a local interconnect pattern for the second component; (iv) opening a second hole in the second insulator layer to expose the top of the first plug; and (v) depositing a layer of refractory metal (and associated thin barrier/adhesive layers of Ti/TiN) in the first hole to form a first local interconnect and in the second hole to form a bottom electrode.

Another embodiment of the invention is a system-on-chip comprising: (i) a silicon substrate, the silicon substrate having arrayed thereon at least one first component comprising a DRAM wordline and at least one second component selected from the group consisting of a device comprising a logic gate, an SRAM or a combination thereof; (ii) a layer of a insulative material overlaying the silicon substrate, the first component and the second component, wherein a first silicon plug, in electrical contact with the first and second component, extends through the layer of protective material to the silicon substrate of like doping and a second silicon plug, in electrical contact with the second component and abutting first plug, extends through the layer of insulative material to the silicon substrate of like doping; and (iii) a local interconnect comprising a salicide layer located over, and in electrical contact with, the first silicon plug and the second silicon plug.

BRIEF DESCRIPTION OF THE DRAWINGS

Preferred embodiments of the invention are described below with reference to the following accompanying drawings, which are for illustrative purposes only. Throughout the following views, reference numerals will be used in the drawings, and the same reference numerals will be used throughout the several views and in the description to indicate same or like parts.

DETAILED DESCRIPTION OF THE PREFERRED EMBODIMENTS

In the following detailed description, references made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention.

The terms "wafer" or "substrate" used in the following description include any semiconductor-based structure having a silicon surface. Wafer and substrate are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when references made to a wafer or substrate in the following description, previous process steps may have been used to form regions or junctions in the base semiconductor structure or foundation.

Figure 1:
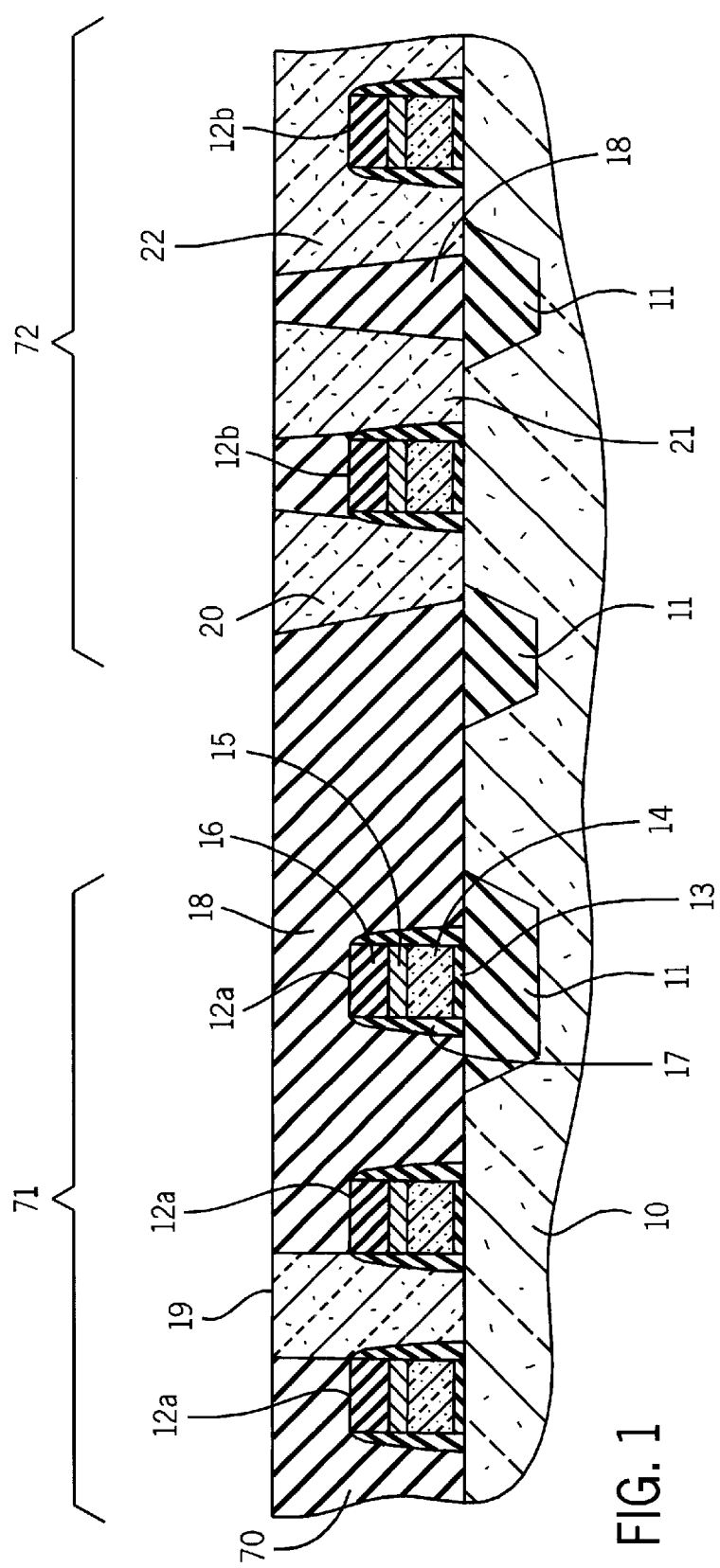
FIG. 1 is a cross-sectional view of a wafer suitable for undergoing the process of the invention.

The process of the invention to form plugs and local interconnects starts subsequent to the formation of a semiconductor device having an embedded DRAM array along with other components, such as logic or SRAM arrays and appropriate polysilicon contact plugs. An example of such a semiconductor device 70, which for illustration comprises a DRAM array 71 and a DRAM periphery/logic/SRAM array/SRAM periphery 72, is shown in FIG. 1. The device 70 comprises a silicon substrate 10 having isolation areas 11 which are typically shallow trench isolation (STI) oxides. A number of transistors 12a–b are arrayed on substrate 10. Transistors 12a are part of a DRAM array 71. Transistors 12b are part of a DRAM periphery/logic/SRAM array/SRAM periphery 72. Transistors 12a–b consist of a number of layers. In an exemplary transistor 12a–b (FIG. 1), layer 13 is a gate oxide comprising silicon dioxide. Layer 14 is a single or dual-doped polysilicon which, for transistors 12a, comprises a wordline. Layer 15 is a tungsten/tungsten nitride (or tungsten silicide) layer. Layer 16 is a silicon nitride cap. Layer 17 is a silicon nitride spacer. The substrate 10 and transistors 12a–b are all overlaid with a insulative layer 18 which has been formed over the device by conventional chemical vapor deposition (CVD) or other suitable means. Typically, insulative layer 18 is borophosphosilicate (BPSG), phosphosilicate glass (PSG), or silicon dioxide, preferably BPSG. Plugs 19, 20, 21, 22 comprise heavily doped polysilicon and provide electrical pathways to the transistors 12a–b and silicon substrate 10. The conductive plugs 19, 20, 21, 22 are composed of different conductivity type materials.

Semiconductor device 70 may be fabricated by known means such as described in copending U.S. patent application Ser. No. 09/268,737 which is incorporated herein by reference. Briefly, U.S. patent application Ser. No. 09/268,737 provides a method for making a semiconductor device with conductive plugs 19, 20, 21, 22 of different conductivity types in contact with the active areas of a semiconductor substrate 10 and the active layers of devices such as transistors 12a–b, as depicted in FIG. 1 (device 70). Although not shown, the insulative layer 18 (e.g., BPSG) of the semiconductor device 70 is selectively etched to a semiconductor region of one conductivity type and to the protective layers nitride in our example of an active device (such as transistors 12a–b) to provide openings that are subsequently filled with conductive material of a first type (such as N-type doped polysilicon) to form conductive plugs, e.g., 19, 22. Next, the insulative layer is again selectively etched down to a semiconductor region of an opposite conductivity type and to the protective layers nitride in our example of an active device (such as transistors 12a–b) to provide openings that are subsequently filled with conductive material of a type different than that of the first conductive material (such as P-type doped polysilicon) to form conductive plugs, e.g., 21. The conductive materials are then removed from the surface of the insulative layer 18, for example by CMP processing. The resulting structure is device 70.

Figure 2:
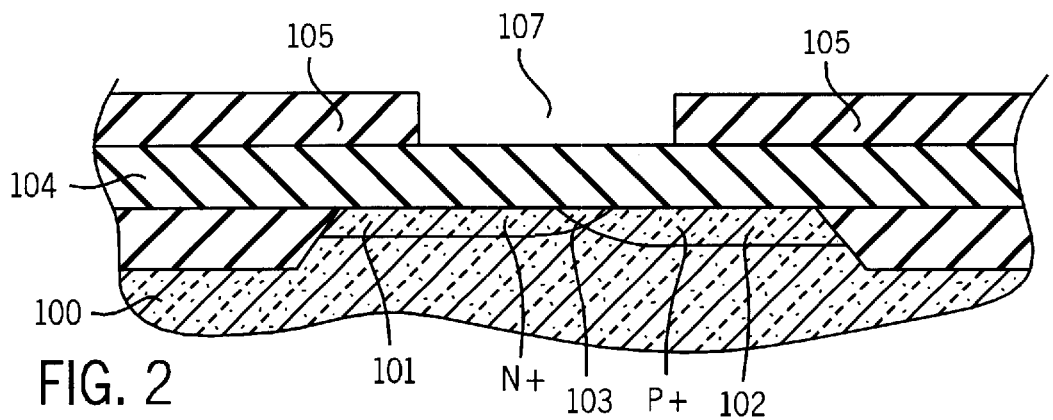
FIG. 2 shows a cross-sectional view of a wafer having a diffused N-P junction undergoing the process of an embodiment of the invention.
Figure 16:
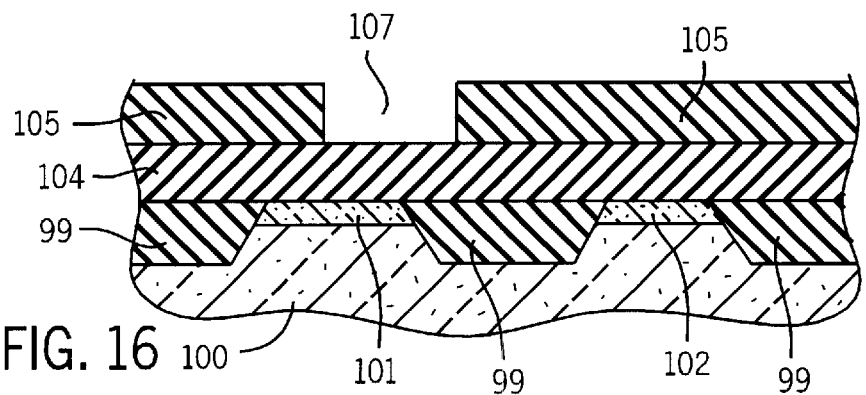
FIG. 16 shows a cross-sectional view of a wafer having isolated N-type and P-type regions undergoing a process of the invention.

FIGS. 2–10 and 16 shows one embodiment of the current invention. Referring to FIG. 2, substrate 100 has a region of diffused N-type conductivity 101 and a region of diffused P-type conductivity 102. Regions 101 and 102 may overlap to form a diffused junction 103 (as shown in FIG. 2), or may be separated by shallow trench isolation 99 (STI) (as shown in FIG. 16). Substrate 100 is overlaid with an insulative layer 104 which has been formed over the substrate 100 by CVD or other suitable means. Typically, insulative layer 104 is BPSG, PSG, or silicon oxide, preferably BPSG. Preferably, the substrate 100 forms part of a semiconductor device comprising both logic and memory. An example of such a device is semiconductor device 70, as shown in FIG. 1.

Figure 3:
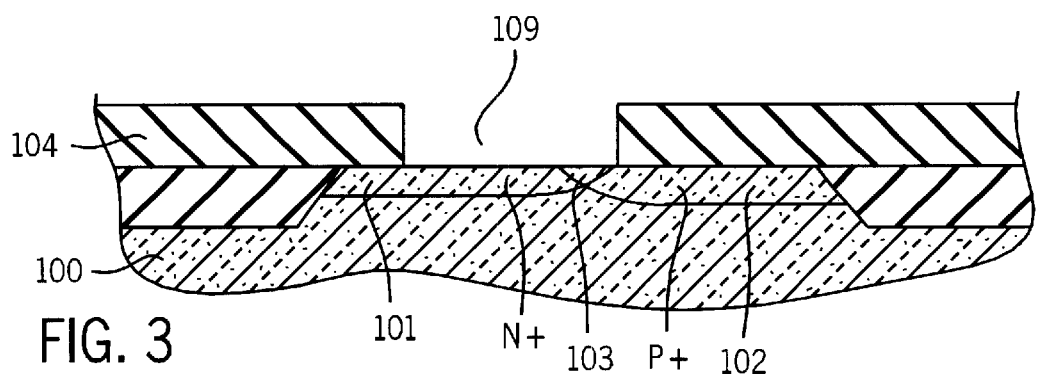
FIG. 3 shows the wafer of FIG. 2 at a processing step subsequent to that shown in FIG. 2.

The process of the invention begins by applying a photoresist masking layer 105 having a first opening 107 to define an area to be etched, as shown in FIG. 2. A portion of the insulative layer 104 is etched to form a first plug opening 109 to expose at least portions of the N-type conductivity region 101, and the diffused junction 103 (or STI 99), as shown in FIG. 3. A directional etching process, such as RIE, can be used to etch the insulative layer 104 to form the first plug opening 109. After the etch, the photoresist layer 105 is removed as shown in FIG. 3.

Figure 4:
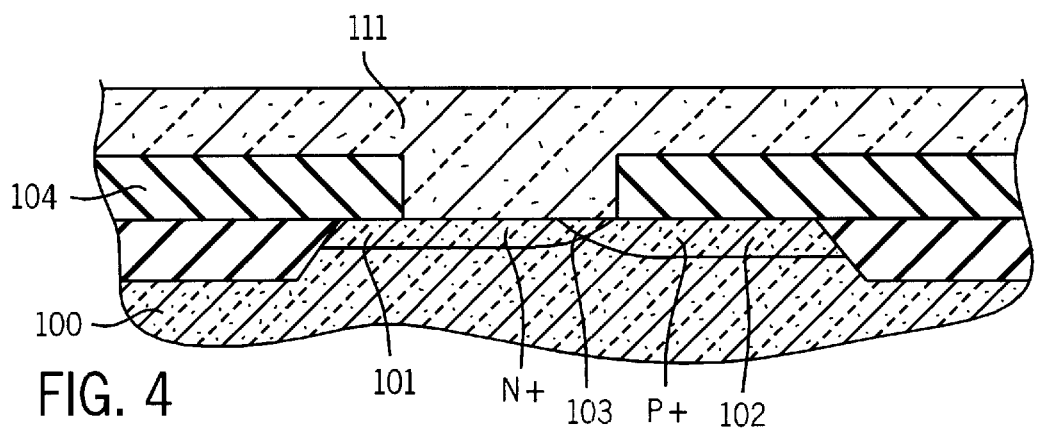
FIG. 4 shows the wafer of FIG. 2 at a processing step subsequent to that shown in FIG. 3.
Figure 5:
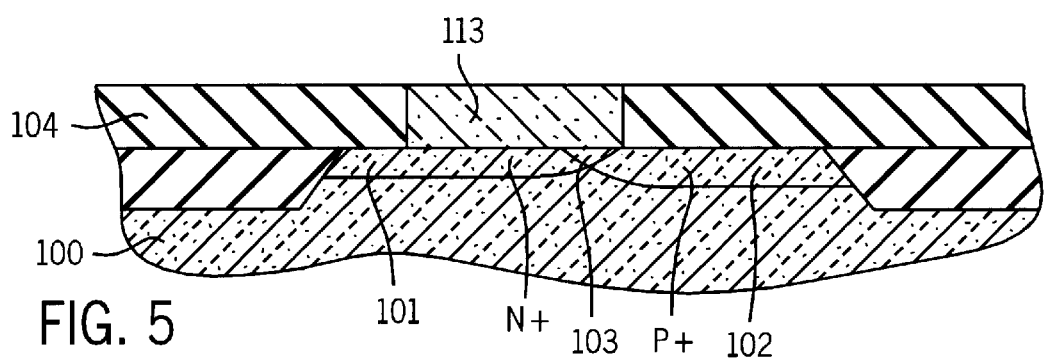
FIG. 5 shows the wafer of FIG. 2 at a processing step subsequent to that shown in FIG. 4.

A highly doped N-type conductivity polysilicon is deposited over the surface of the insulative layer 104 and into the opening 109 to form layer 111, as shown in FIG. 4. After the highly doped N-type conductivity polysilicon is deposited, a conventional CMP/Etch-back process is used to remove the polysilicon layer 111 overlying the insulative layer 104, to form plug 113, as shown in FIG. 5.

Figure 6:
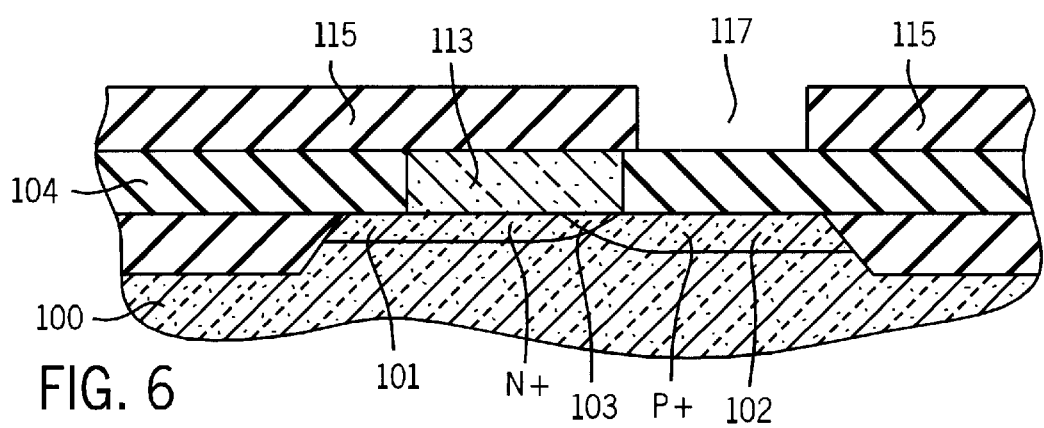
FIG. 6 shows the wafer of FIG. 2 at a processing step subsequent to that shown in FIG. 5.
Figure 7:
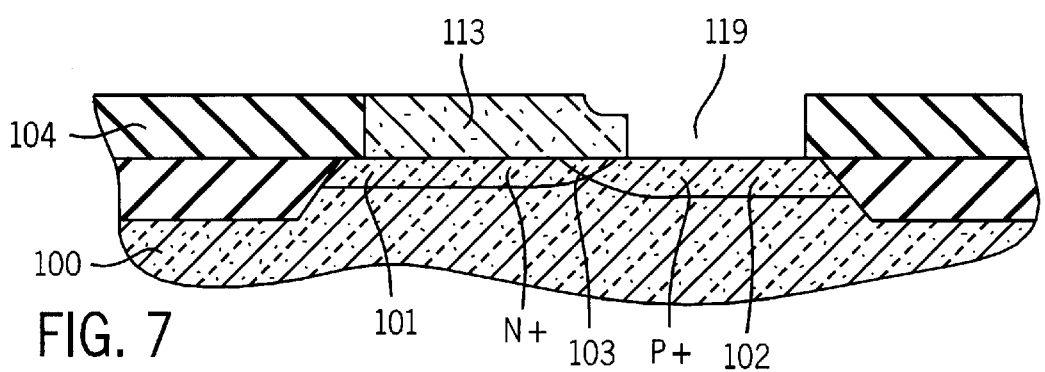
FIG. 7 shows the wafer of FIG. 2 at a processing step subsequent to that shown in FIG. 6.

FIG. 6 depicts the next step, in which a second photoresist masking layer 115 having opening 117 is applied to define an area to be etched. A directional etching process, such as RIE, that is selective to silicon, can be used to etch the insulative layer (e.g. BPSG) 104 and, optionally, plug 113 to form the plug opening 119 and expose at least a portion of the P-type conductivity region 102, as shown in FIG. 7. After the etch, the photoresist layer 115 is removed as shown in FIG. 7.

Figure 8:
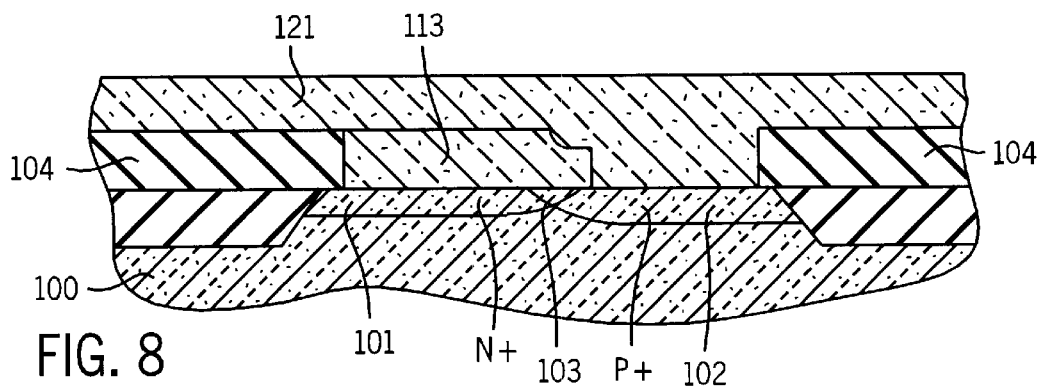
FIG. 8 shows the wafer of FIG. 2 at a processing step subsequent to that shown in FIG. 7.
Figure 9:
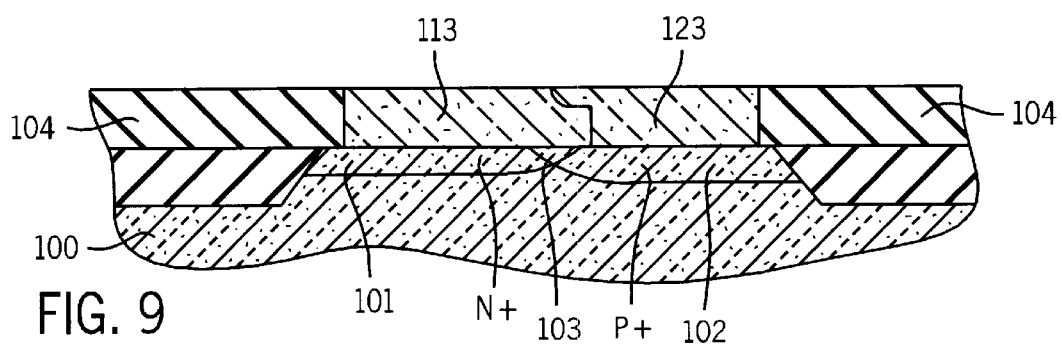
FIG. 9 shows the wafer of FIG. 2 at a processing step subsequent to that shown in FIG. 8.

Next, a layer 121 of a heavily doped P-type polysilicon is blanket deposited over the exposed surfaces and into the opening 119 as shown in FIG. 8. Next, a conventional CMP/Etch-back process is used to remove the polysilicon layer overlying the insulative layer 104 and the plug 113, to form plug 123, as shown in FIG. 9.

Figure 10:
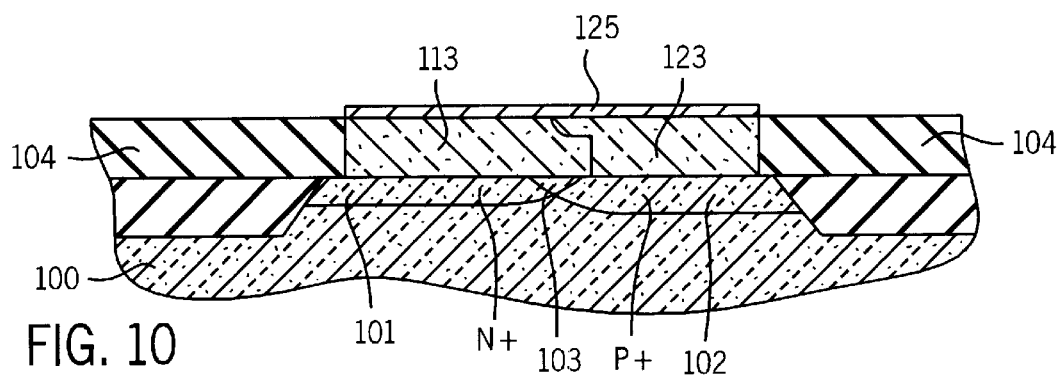
FIG. 10 shows the wafer of FIG. 2 at a processing step subsequent to that shown in FIG. 9.

FIG. 10 shows the next step of the inventive process wherein a salicide layer 125 is formed over the exposed surfaces of conductive plugs 113 and 123. The salicide layer 125 forms a local interconnect that allows the use of only one contact (not shown) to either side of the dual-conductivity plugs 113, 123 for a connection. The salicide layer 125 may be formed by any convenient process, for example, Ti or Co is blanket deposited by conventional PVD (sputtering) over the exposed surfaces. A, low temperature thermal anneal in $N_2$ (~650° C. for Ti and ~400–500° C. for Co) is next used to react the Ti or Co metal component and the Si exposed at the surface of the substrate 100 to form a metastable C49 phase of $TiSi_2$. The blanket deposition is then etched to selectively using $H_2O:H_2O_2:NH_4OH$ remove only the TiN, leaving behind the C49 $TiSi_2$. An optional second thermal step is carried out to convert the C49-phase $TiSi_2$ to the more stable, lower resistivity C54-phase $TiSi_2$. The thermal steps are carried out by RTP in an $N_2$ atmosphere.

Figure 11:
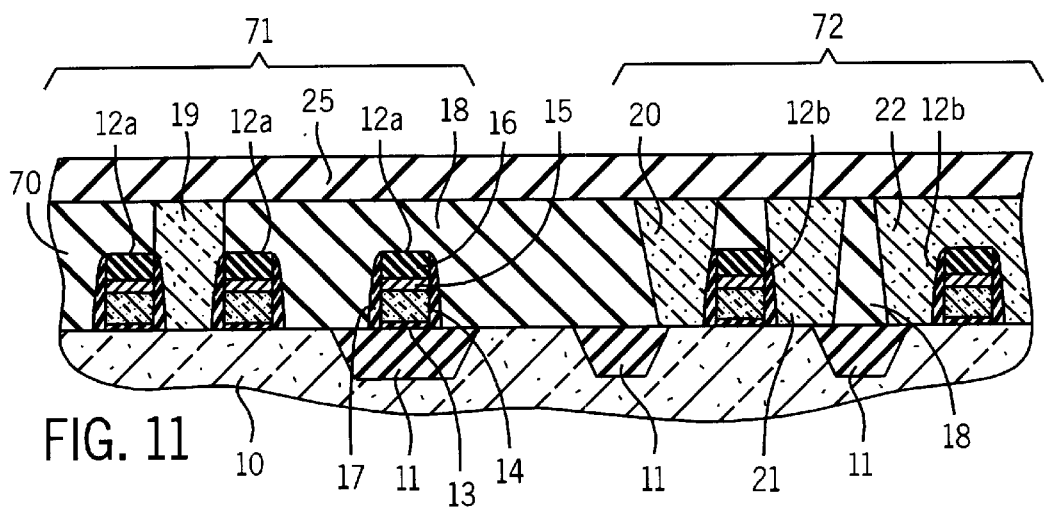
FIG. 11 shows the wafer of FIG. 1 undergoing another embodiment of the invention at a processing step subsequent to that shown in FIG. 1.

Another embodiment of the method of the invention to form a local interconnect begins subsequent to the formation of a semiconductor device 70 such as shown in FIG. 1. As shown in FIG. 11, a second insulative layer 25, typically silicon oxide, is deposited over the exposed surface of the first insulative layer 18 and over the exposed surfaces of the polysilicon plugs 19, 20, 21, 22. Any practical means for depositing the second insulative layer may be used. Example processes include CVD, ozone/tetraethylorthosilicate (TEOS), and plasma enhanced chemical vapor deposition (PECVD) deposition methods, which are well known to one skilled in the art.

Figure 12:
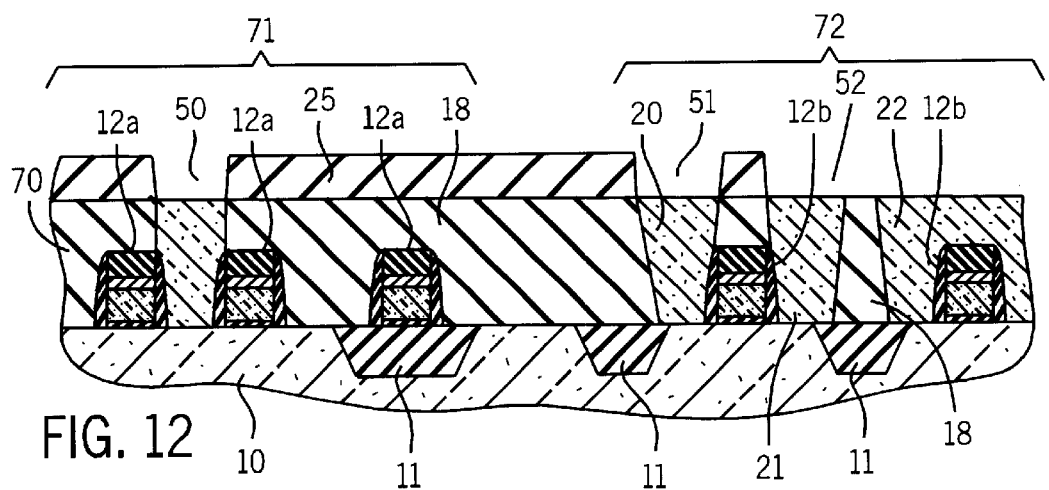
FIG. 12 shows the wafer of FIG. 1 at a processing step subsequent to that shown in FIG. 11.

Next, photolithographic techniques using a photoresist mask are used to define the interconnect line to be etched into the second insulative layer 25. As shown in FIG. 12, layer 25 is patterned and etched to form openings 51, 52 to the plugs 20, 21, 22 of DRAM periphery/logic/SRAM array/SRAM periphery 72. Optionally, layer 25 is also patterned and etched to form opening 50 to expose the N-plug for the DRAM array 71. The photoresist is then removed by conventional cleaning methods.

Figure 13:
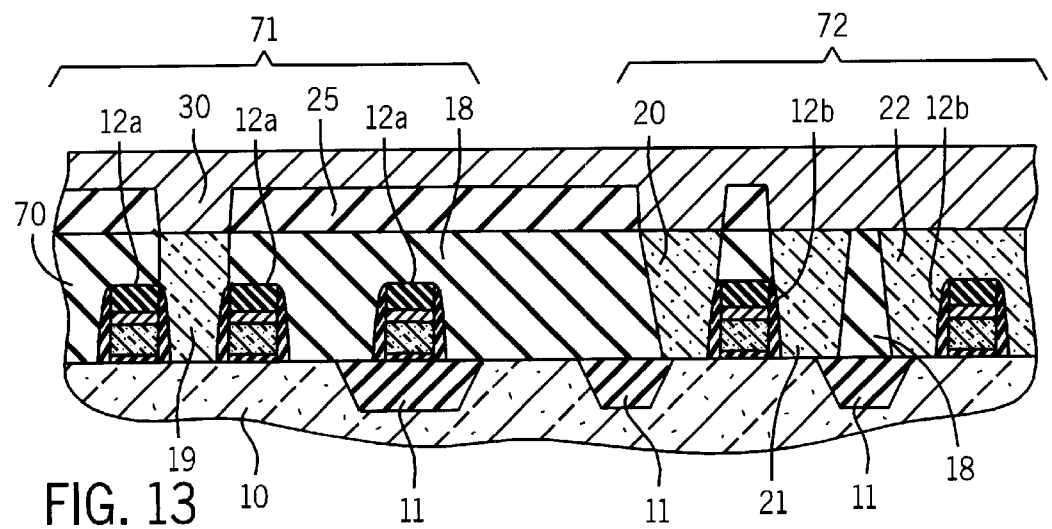
FIG. 13 shows the wafer of FIG. 1 at a processing step subsequent to that shown in FIG. 12.

Next, a blanket layer 30 of tungsten, or another refractory metal, is deposited on the exposed surfaces of the device 70 sufficient to fill openings 50, 51, 52, as shown in FIG. 13. Any practical method for depositing tungsten can be used. Typically, tungsten and associated thin Ti/TiN layers is deposited by low pressure chemical vapor deposition (LPCVD) in a cold-wall, low pressure system. The tungsten can be deposited from tungsten hexafluoride or tungsten hexachloride, preferably tungsten hexafluoride. The CVD of tungsten is well known in the art and is described in more detail in *Silicon Processing*, pg. 207–213. The tungsten deposition is preceded by depositing a titanium layer followed by annealing by RTP in nitrogen ambient atmosphere. The optional titanium layer aids in decreasing the sheet resistance of the local interconnect and the reacted TiN serves as an adhesion/barrier layer.

Figure 14:
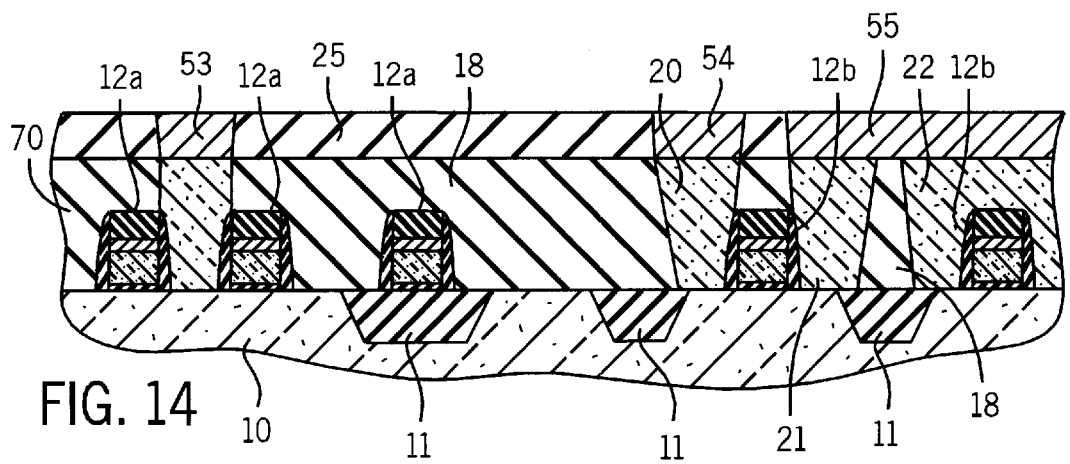
FIG. 14 shows the wafer of FIG. 1 at a processing step subsequent to that shown in FIG. 13.

Next after deposition of the tungsten layer 30, a conventional chemical mechanical polishing (CMP) or etch back (Plasma Dry Etch) is used to remove the tungsten (and titanium nitride) layer overlying the second insulative layer 25. This results in tungsten interconnects 53, 54, and 55 within layer 25, as shown in FIG. 14.

When DRAM plug 19 is unmasked to the foregoing tungsten deposition process resulting in the formation of tungsten plug 53 (FIG. 14), the tungsten plug 53 can serve as the bottom capacitor electrode for metal-insulator-metal/metal-insulator-semiconductor (MIM/MIS) or simply as a bit line contact for a standard cell capacitor as well as MIM/MIS.

Figure 15:
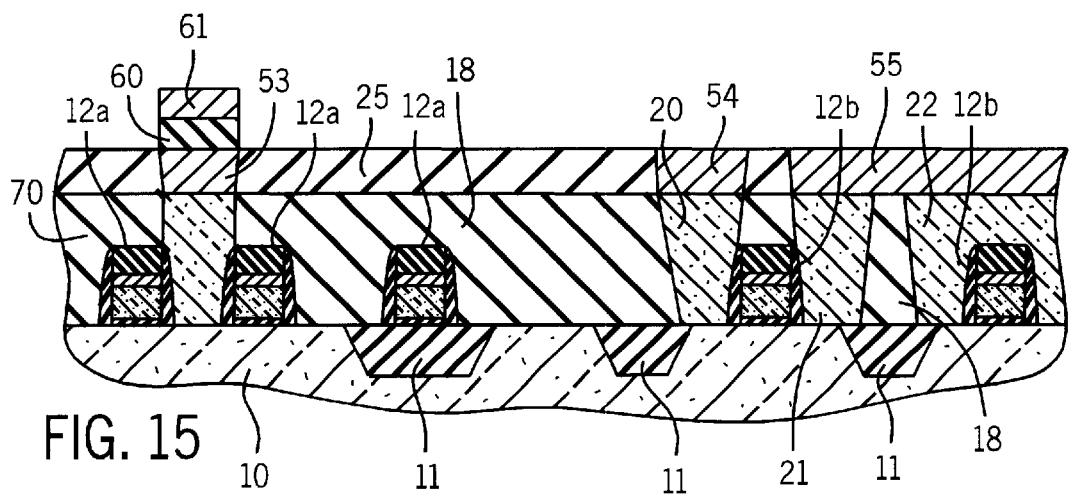
FIG. 15 shows the wafer of FIG. 1 with a possible mim/mis capacitor for reference only.

In one embodiment of a MIM/MIS capacitor, shown in FIG. 15, an insulating layer 60 is deposited, for example by CVD, over tungsten plug 53. The insulating layer 60 may be silicon oxide or silicon nitride. Next, a conducting layer 61 is deposited over insulating layer 60 to form a MIM/MIS capacitor. The conducting layer 61 may comprise a refractory metal, such as tungsten, aluminum, or a doped polysilicon. Any suitable means, such as CVD or any other means may be used to deposit the conducting layer 61. The insulator 60 and conducting layer 61 can be etched by photolithography to form the structure shown in FIG. 15.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of fabricating silicided plugs, the method comprising the steps of:

providing a silicon substrate overlaid with an insulative layer; the silicon substrate having at least one N-type doped region and at least one P-type doped region, wherein the N-type doped region and P-type doped region are arranged to form at least one diffused source/drain junction;

forming a first opening in the insulative layer to expose the diffused source/drain junction and at least part of the N-type doped region and/or the P-type doped region;

depositing a first highly doped polysilicon into the first opening to form a first plug, the first plug having an exposed surface;

forming a second opening in the insulative layer adjacent to the first plug to expose at least part of the doped region having a different type doping than the first highly doped polysilicon;

depositing a second highly doped polysilicon, having the same type doping as the region exposed by the second opening, into the second hole to form a second plug abutting the first plug, the second plug having an exposed surface; and forming a silicide layer over the exposed surfaces of the first plug and the second plug.

2. The method of fabricating silicided plugs of claim 1, wherein the insulative layer comprises borophosphosilicate glass or phosphosilicate glass.

3. A method of fabricating silicided plugs, the method comprising the steps of:

providing a silicon substrate overlaid with an insulative layer; the silicon substrate having at least one N-type doped region and at least one P-type doped region, wherein the N-type doped region and P-type doped region are separated by isolation;

forming a first opening in the insulative layer to expose at least part of the N-type doped region and/or P-type doped region;

depositing a first highly doped polysilicon into the first opening to form a first plug, the first plug having an exposed surface;

forming a second opening in the insulative layer adjacent to the first plug to expose at least part of the doped region having a different type doping than the first highly doped polysilicon;

depositing a second highly doped polysilicon, having the same type doping as the region exposed by the second opening, into the second hole to form a second plug abutting the first plug, the second plug having an exposed surface; and forming a silicide layer over the exposed surfaces of the first plug and the second plug.

4. The method of fabricating silicided plugs of claim 3, wherein the insulative layer comprises borophosphosilicate glass or phosphosilicate glass.

5. A method of fabricating a system-on-chip, the method comprising the steps of:

providing a silicon substrate having at least one N-type doped region and at least one P-type doped region, wherein the N-type doped region and P-type doped region are arranged to form at least one diffused source/drain junction, the silicon substrate having arrayed thereon at least one first component comprising a DRAM component and at least one second component selected from the group consisting of a device comprising a logic gate, an SRAM component and a combination thereof, wherein the silicon substrate, the first component and the second component, are overlaid with a layer of an insulative material;

forming a first opening in the insulative layer to expose the diffused source/drain junction and at least part of the N-type doped region and/or the P-type doped region;

depositing a layer of a first highly doped polysilicon into the first opening to form a first plug;

forming a second opening in the insulative layer adjacent to the first plug to expose at least part of the doped region having a different type doping than the first highly doped polysilicon;

depositing a layer of a second highly doped polysilicon, having the same type doping as the region exposed by the second opening into the second hole to form a second plug abutting the first plug, the second plug having an exposed surface; and, forming a silicide layer over the exposed surfaces of the first plug and the second plug.

6. The method of fabricating a system on chip of claim 5, wherein the insulative layer is borophosphosilicate glass or phosphosilicate glass.

7. A method of fabricating a system-on-chip, the method comprising the steps of:

providing a silicon substrate having at least one N-type doped region and at least one P-type doped region, wherein the N-type doped region and P-type doped region are separated by isolation, the silicon substrate having arrayed thereon at least one first component comprising a DRAM component and at least one second component selected from the group consisting of a device comprising a logic gate, an SRAM component and a combination thereof, wherein the silicon substrate, the first component and the second component, are overlaid with a layer of an insulative material;

forming a first opening in the insulative layer to expose at least part of the N-type doped region and/or the P-type doped region;

depositing a layer of a first highly doped polysilicon into the first opening to form a first plug;

forming a second opening in the insulative layer adjacent to the first plug to expose at least part of the doped region having a different type doping than the first highly doped polysilicon;

depositing a layer of a second highly doped polysilicon, having the same type doping as the region exposed by the second opening into the second hole to form a second plug abutting the first plug, the second plug having an exposed surface; and, forming a silicide layer over the exposed surfaces of the first plug and the second plug.

8. The method of fabricating a system on chip of claim 7, wherein the insulative layer is borophosphosilicate glass or phosphosilicate glass.

9. A method of fabricating a system-on-chip, the method comprising the steps of:

providing a semiconductor device comprising a silicon substrate, the silicon substrate having arrayed thereon at least one first component comprising a DRAM component and at least one second component selected from the group consisting of a device comprising a logic gate, an SRAM component, and a combination thereof; wherein the silicon substrate, the first component and the second component are overlaid with a layer of an insulative material, a first silicon plug, in electrical contact with the first component, extends through the layer of insulative material to the silicon substrate, and a second silicon plug, in electrical contact with the second component, extends through the layer of insulative material to the silicon substrate, the first and second plugs having an exposed surface; and forming a metal silicide layer over the exposed surfaces of the first plug and the second plug.

10. The method of fabricating a system-on-chip of claim 9 wherein the insulative material is borophosphosilicate glass or phosphosilicate glass.

11. The method of fabricating a system-on-chip of claim 9, wherein the metal silicide layer overlying the second plug comprises a local interconnect for a device comprising a logic gate and an SRAM.

12. A method of fabricating a system-on-chip, the method comprising the steps of:

providing a semiconductor device comprising a silicon substrate, the silicon substrate having arrayed thereon at least one first component comprising a DRAM component and at least one second component selected from the group consisting of a device comprising a logic gate, an SRAM component, and a combination thereof; wherein the silicon substrate, the first component and the second component are overlaid with a layer of an insulative material, a first silicon plug, in electrical contact with the first component, extends through the layer of insulative material to the silicon substrate, and a second silicon plug, in electrical contact with the second component, extends through the layer of insulative material to the silicon substrate, the first and second plugs having an exposed surface;

depositing an oxide layer over the layer of insulative material, and the exposed surfaces of the first plug and the second plug;

forming an opening in the oxide layer to expose the second plug; and depositing a tungsten material into the opening to form an interconnect in contact with the second plug.

13. The method of fabricating a system-on-chip of claim 12, further comprising the step of depositing a layer of titanium into the opening prior to the step of depositing the tungsten material.

14. The method of fabricating a system-on-chip of claim 13, further comprising the step of annealing the titanium layer by rapid thermal processing in a nitrogen ambient prior to the step of depositing the tungsten material.

15. A method of fabricating a system-on-chip, the method comprising the steps of:

providing a semiconductor device comprising a silicon substrate, the silicon substrate having arrayed thereon at least one first component comprising a DRAM component and at least one second component selected from the group consisting of a device comprising a logic gate, an SRAM component, and a combination thereof; wherein the silicon substrate, the first component and the second component are overlaid with a layer of an insulative material, a first silicon plug, in electrical contact with the first component, extends through the layer of insulative material to the silicon substrate, and a second silicon plug, in electrical contact with the second component, extends through the layer of insulative material to the silicon substrate;

depositing an oxide layer on top of the layer of insulative material, the first plug and the second plug;

forming an opening through the oxide layer to expose the second plug;

depositing a layer of tungsten over the oxide layer and into the opening; and removing the tungsten material overlying the oxide layer to form an interconnect within the opening in contact with the second plug.

16. The method of fabricating a system-on-chip of claim 15, further comprising the step of depositing a layer of titanium into the opening prior to the step of depositing the layer of tungsten.

17. The method of fabricating a system-on-chip of claim 16, further comprising the step of rapid thermal processing of the titanium layer in a nitrogen ambient after the deposition of titanium and before the deposition of the tungsten material.

18. A method of fabricating a system-on-chip, the method comprising the steps of:

providing a semiconductor device comprising a silicon-substrate, the silicon substrate having arrayed thereon at least one first component comprising a DRAM component and at least one second component selected from the group consisting of a device comprising a logic gate, an SRAM component, and a combination thereof, wherein the silicon substrate, the first component and the second component are overlaid with a layer of an insulative material, a first silicon plug, in electrical contact with the first component, extends through the layer of insulative material to the silicon substrate, and a second silicon plug, in electrical contact with the second component, extends through the layer of insulative material to the silicon substrate;

depositing an oxide layer on top of the layer of insulative material, the first plug and the second plug;

forming a first opening through the oxide layer to expose the second plug;

forming a second opening through the oxide layer to expose the first plug; and depositing a layer of tungsten into the first opening to form a first interconnect in contact with the first plug, and into the second opening to form a second interconnect in contact with the second plug.

19. The method of fabricating a system-on-chip of claim 18, further comprising the step of depositing a layer of titanium in at least one of the first and second openings prior to the step of depositing the layer of tungsten.

20. The method of fabricating a system-on-chip of claim 19, further comprising the step of rapid thermal processing the titanium layer in a nitrogen ambient after the deposition of the titanium layer and before the deposition of tungsten.

21. A method of fabricating a system-on-chip, the method comprising the steps of:

providing a semiconductor device comprising a silicon substrate, the silicon substrate having arrayed thereon at least one first component comprising a DRAM component and at least one second component selected from the group consisting of a device comprising a logic gate, an SRAM component, and a combination thereof, wherein the silicon substrate, the first component and the second component are overlaid with a layer of a protective material, a first silicon plug, in electrical contact with the first component, extends through the layer of protective material to the silicon substrate, and a second silicon plug, in electrical contact with the second component, extends through the layer of protective material to the silicon substrate;

depositing an oxide layer over the layer of protective material, the first plug and the second plug;

forming a first opening in the oxide layer to expose the second plug;

forming a second opening in the oxide layer to expose the first plug;

depositing a layer of tungsten into the first opening to form a first interconnect and into the second opening to form a second interconnect;

depositing an insulating layer over the second interconnect; and depositing a conducting layer over the insulating layer to form a MIM/MIS electron source.

22. The method of fabricating a system-on-chip of claim 21, further comprising the step of depositing a layer of titanium in at least one of the first and second openings prior to the step of depositing the layer of tungsten.

23. The method of fabricating a system-on chip of claim 22, further comprising the step of rapid thermal processing of the titanium layer in a nitrogen ambient after the deposition of titanium and before the deposition of tungsten.

24. The method of fabricating a system-on-chip of claim 21, wherein the insulating layer is deposited by chemical vapor deposition.

25. The method of fabricating a system-on-chip of claim 22, wherein the insulating layer comprises silicon oxide.

26. The method of fabricating a system-on-chip of claim 21, wherein the conducting layer is deposited by chemical vapor deposition.

27. The method of fabricating a system-on-chip on claim 21, wherein the conducting layer is a refractory metal.

28. The method of fabricating a system-on-chip of claim 21, wherein the conducting layer is a doped polysilicon.

* * * * *